(12) United States Patent
Itoh et al.

(10) Patent No.: US 7,847,290 B2
(45) Date of Patent: Dec. 7, 2010

(54) THIN FILM TRANSISTOR SUBSTRATE WITH DIVIDED GATE ELECTRODE

(75) Inventors: Yasuyoshi Itoh, Tokyo (JP); Yuichi Masutani, Tokyo (JP); Masaru Aoki, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/411,799

(22) Filed: Mar. 26, 2009

(65) Prior Publication Data

US 2009/0242886 A1 Oct. 1, 2009

(30) Foreign Application Priority Data

Mar. 27, 2008 (JP) .......................... P2008-083310

(51) Int. Cl.
*H01L 33/00* (2010.01)
(52) U.S. Cl. .................................. 257/59; 257/E33.053
(58) Field of Classification Search .................. 257/59, 257/72; 349/139
See application file for complete search history.

(56) References Cited

U.S. PATENT DOCUMENTS

| | | | |
|---|---|---|---|
| 6,255,130 B1 * | 7/2001 | Kim | 438/30 |
| 6,310,669 B1 | 10/2001 | Kobayashi et al. | |
| 6,650,378 B2 | 11/2003 | Kobayashi et al. | |
| 7,157,319 B2 | 1/2007 | Ishikawa et al. | |
| 7,625,782 B2 * | 12/2009 | Kim | 438/149 |
| 7,638,846 B2 * | 12/2009 | Kitakado et al. | 257/350 |
| 2001/0019373 A1 * | 9/2001 | Kobayashi et al. | 349/39 |
| 2004/0089900 A1 | 5/2004 | Ishikawa et al. | |
| 2005/0092998 A1 * | 5/2005 | Yamazaki et al. | 257/72 |
| 2006/0067143 A1 * | 3/2006 | Kim | 365/201 |
| 2006/0086937 A1 * | 4/2006 | Fujii et al. | 257/72 |
| 2006/0238450 A1 * | 10/2006 | Onodera | 345/60 |
| 2008/0026299 A1 * | 1/2008 | Chai et al. | 430/5 |
| 2010/0038640 A1 * | 2/2010 | Kim | 257/48 |

FOREIGN PATENT DOCUMENTS

| | | |
|---|---|---|
| JP | 10-163174 | 6/1998 |
| JP | 11-242241 | 9/1999 |
| JP | 2000-164886 | 6/2000 |
| JP | 2002-141512 | 5/2002 |
| JP | 2008-33330 | 2/2008 |

* cited by examiner

*Primary Examiner*—Nathan W Ha
(74) *Attorney, Agent, or Firm*—Oblon, Spivak, McClelland, Maier & Neustadt, L.L.P.

(57) ABSTRACT

In forming a thin film transistor using multi-tone exposure, a wiring width of a foundational wiring is 40 μm or less, and a ratio of a wiring width of a foundational wiring in a dense case to a space between adjacent wirings is 1.7, preferably 1.0 or less.

6 Claims, 6 Drawing Sheets

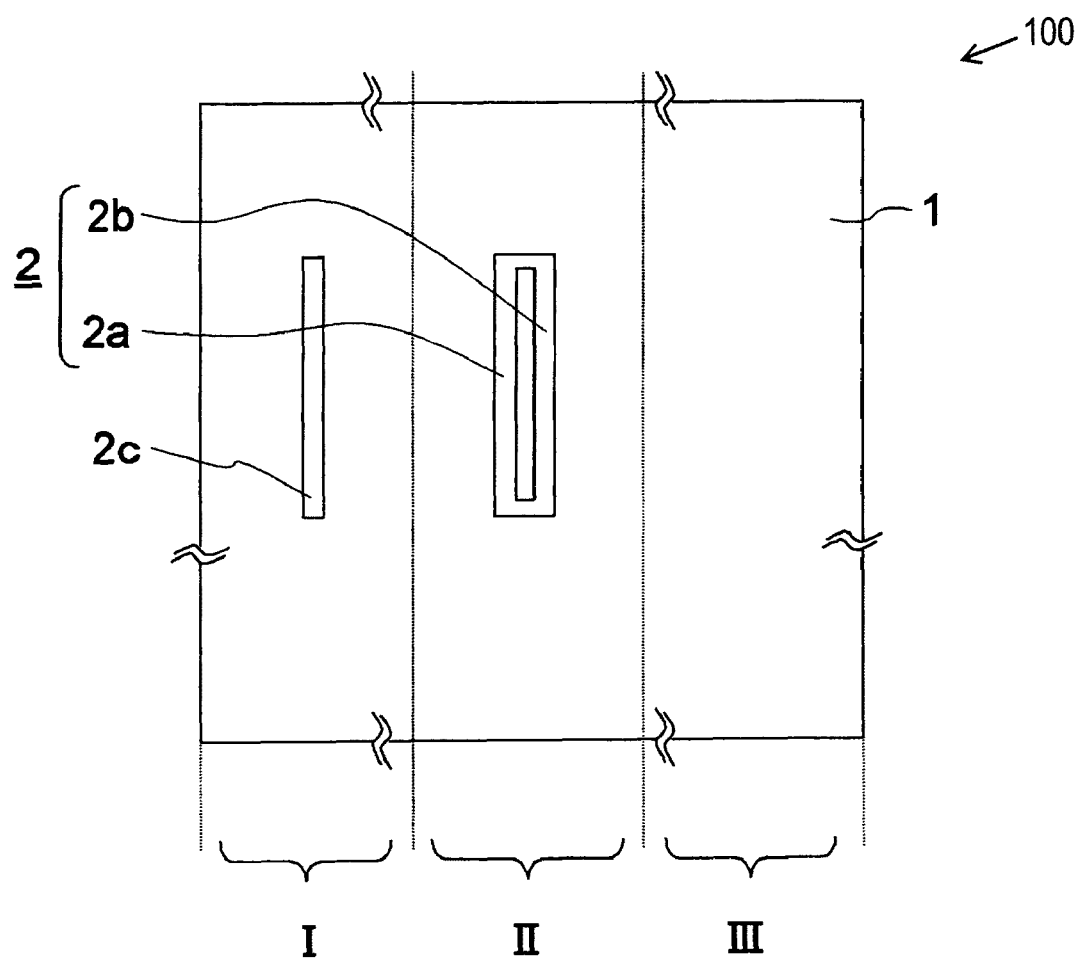

THIN FILM TRANSISTOR SUBSTRATE WITH DIVIDED GATE ELECTRODE

This application claims priority from Japanese Patent Application No. 2008-083310 filed on Mar. 27, 2008, the entire subject matter of which is incorporated herein by reference.

BACKGROUND OF THE INVENTION

1. Field of the Invention

The present invention relates to an inverted staggered type thin film transistor (hereinafter, referred to as TFT) substrate applied to an active matrix display.

2. Description of the Related Art

Recently, in the field of display using semiconductor devices, liquid crystal displays for energy saving and space saving have rapidly come into wide use instead of the known CRT displays. In such liquid crystal displays, a plurality of electrodes, wirings, and elements are provided on a transparent insulating substrate. Specifically, switching elements such as thin film transistors (TFT) having a scanning wiring, a signal wiring, a gate electrode, a source electrode, and a drain electrode are provided in array, and an active matrix type TFT array substrate applying a video signal independent from an electrode to each display pixel is widely used.

Since a large number of processes are necessary to manufacture the active matrix type TFT array substrate, there is a problem in productivity, for example, increase of the number of manufacturing devices and increase of the incidence of inferior goods. As a general manufacturing method, there is a manufacturing method (hereinafter, referred to as 5-mask process) performing a photolithography process five times (see JP-A-11-242241).

In addition, recently, as a method for reducing the number of sheets used to form a thin film transistor substrate, there is a method of applying halftone exposure (hereinafter, referred to as gray tone exposure) to a back channel portion of TFT (see JP-A-2000-164886). This method is a so-called "four-mask process". In an inverted staggered type TFT forming process of the method, a gate insulating film, a semiconductor layer, and a source wiring material are continuously formed after forming a gate electrode, and the gray tone exposure is applied to exposure of a back channel forming region of TFT. The method is an influential method to reduce a manufacturing cost, and thus technical development for practical use has been promoted.

However, in the case of using the gray tone exposure, when a film thickness (hereinafter, referred to as "GT resist film thickness) of resist in a region where halftone exposure illumination is applied is not regularly controlled, it has an influence on subsequent processes and a desired pattern cannot be obtained. The reason why the film thickness of the resist cannot be regularly controlled is a foundational condition of the region where the halftone exposure illumination is applied, in addition to process factors such as uniformity of exposure intensity on the substrate and uniformity of a thickness of the coated resist on the substrate (see JP-A-2002-141512 and JP-A-2008-33330). Hereinafter, an influence of the foundation on the film thickness of the resist formed by the gray tone exposure, and a problem according thereto will be described.

The case of forming the TFT substrate of the active matrix type display will be described by way of example. Mostly, the TFT is used as a switching element for sending a display signal of each pixel coming through a source signal line, to a predetermined pixel. However, recently, to improve functions and productivity of displays, a circuit for increasing an added value may be mounted in the TFT substrate, or a circuit for test may be mounted outside a pixel display region. In this case, electrodes in the display may have different purposes and limitations. Accordingly, even when the electrodes are formed as the same layer, the electrode patterns have various sizes and shapes different from each other.

FIG. 9 shows a schematic view for explaining pattern size dependency of a gate wiring as a foundation. FIG. 10(a) to (c) shows cross-sectional views in a process of forming a source wiring with respect to regions I to III corresponding to the line C-C. FIG. 10(a) shows the region I where there is a relative narrow gate wiring 12a on a glass substrate 1. FIG. 10(b) shows the region II where there is a gate wiring 12b wider than the gate wiring 12a. FIG. 10(c) shows the region III where there is no gate wiring. Herein, the term of "gate wiring" is used as wide means including a gate electrode where a general thin film transistor is formed.

Generally, a width of a gate wiring of TFT used in a switching element in a pixel region is about 10 to 30 μm, and a structure at the time of patterning a source wiring intersecting above the gate wiring is as shown in FIG. 10(a). In FIG. 10(a), a gate insulating film 13, a semiconductor layer 14, and a conductive layer 15 as a source wiring or a drain wiring are formed to cover the gate wiring 12a patterned on the glass substrate 11. In addition, a resist 16 to pattern the conductive layer 15 and the semiconductor layer 14 is formed. In this case, the following relationship is formed between a film thickness T12 of the resist on the gate wiring 12a and a resist film thickness T11 at a part where there is no gate wiring.

$$T11 > T12 \qquad \text{(Expression 1)}$$

There are many cases that a gate wiring having a relative wide area is formed outside a pixel display region, as the aforementioned circuit for increasing an added value, the circuit for test, and the like. For example, it is necessary to form a TFT having a high current capacitance, that is, a wide channel width, as a test circuit for shortening a test time, since it is necessary to supply signals at once to all pixels connected to one source signal line. In such a case, it is necessary to widen the area of the gate wiring.

For example, when the area is wider than about 100×100 μm, as shown in FIG. 10(b), a resist film thickness T13 on the gate wiring 2b becomes substantially equal to a resist film thickness T14 in FIG. 10(c) showing a region where there is no gate wiring, or the resist film thickness T11 shown in FIG. 10(a).

$$T11 = T13 = T14 \qquad \text{(Expression 2)}$$

The following relationship can be obtained from the relationships of the above-described two Expressions. That is, when a the pattern size of the gate wiring is large, the film thickness of the resist thereon tends to be large as compared with a case of a small pattern size, and the following relationship is formed.

$$T12 < T13 \qquad \text{(Expression 3)}$$

As described above, when the thickness of the coated resist is not uniform by the condition of the foundational pattern, the thickness of the remaining resist does not become uniform even if the gray tone exposure is performed uniform on the entire surface of the substrate perfectly. That is, the film thickness of the resist as the halftone exposure illumination region becomes thinner than a film thickness of a resist of a non-exposure portion (i.e., region where a pattern remains as a wiring). However, the film thickness may become larger than a predetermined value by the foundational condition. In this case, when the resist of the thin film thickness region is removed, the resist cannot be completely removed. Accordingly, necessary etching is not performed by subsequent etching, the back channel portion of the TFT is not formed, and the source and the drain of the TFT form a short circuit.

The resist can be completely removed by means of extending an ashing time. However, in this case, a part of a resist as a mask layer for forming a source/drain wiring is removed. Accordingly, a width of the source/drain wiring becomes smaller than a desired value, and disconnection or cutoff occurs at a part where the resist becomes thin at a part of intersecting with the gate wiring.

To solve such problems, it is conceivable to apply the means described in JP-A-2008-33330. However, in this case, it is necessary to form parts having various transmissivity on the mask side, thereby increasing a cost for manufacturing the mask.

When the means described in JP-A-2000-164886 is applied, a line/space combination or mesh-shaped pattern equal to or less than resolution limit can be formed on the mask, as a method for controlling transmissivity on the mask. However, the pattern equal to or less than the resolution limit needs to be controlled by a grid of about 0.05 μm. For this reason, the channel length of TFT in the region I may be different from the channel length of TFT in the region II, and thus the uniformity of TFT characteristics in the whole panel may be broken down.

SUMMARY OF THE INVENTION

The invention has been made to solve such problems when a patterning process is performed by gray tone exposure.

According to the invention, there is provided a thin film transistor substrate including: a gate wiring; a semiconductor layer formed on the gate wiring; a source wiring connected to the semiconductor layer and intersecting with the gate wiring; and an inverted staggered type thin film transistor formed at the intersecting part of the gate wiring and the source wiring, wherein the gate wiring includes a first gate wiring in a first region, and a second gate wiring wider than the first gate wiring in a second region, wherein a back channel portion of the thin film transistor is patterned by gray tone exposure on the first gate wiring and the second gate wiring, and wherein the second gate wiring is divided into a plurality of gate wiring division patterns connected in parallel.

According to the invention, the resist film thickness by the gray tone exposure within the surface of the substrate can be made uniform. Accordingly, it is possible to stably perform subsequent etching and ashing processes, and it is possible to improve a yield.

BRIEF DESCRIPTION OF THE DRAWINGS

FIG. 1 is a plan view illustrating Embodiment 1 of the invention;

DETAILED DESCRIPTION OF THE PREFERRED EMBODIMENTS

Figure 2A:
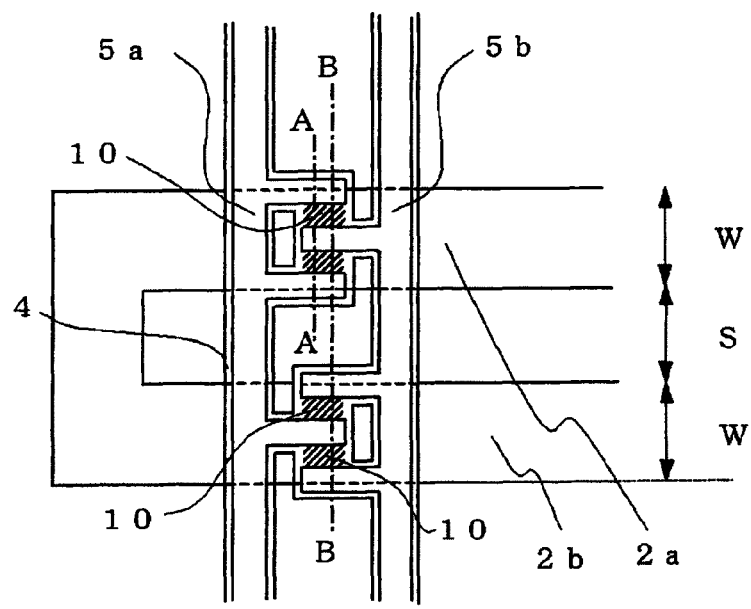
FIG. 2(a) is a plan view illustrating Embodiment 1 of the invention.

FIG. 1 shows a plan view of a thin film transistor substrate 100 according to an embodiment. Incidentally, FIG. 1 is a plan view illustrating only a gate wiring on an insulating substrate 1. FIG. 1 is different from FIG. 10 in that a second gate wiring 2 is formed to connect a gate wiring division pattern 2a and a gate wiring division pattern 2b in parallel to each other in the region II as the second region, which is a characteristic in the invention. In the region I, the thin film transistor is disposed in matrix, and a first gate wiring 2c is formed in a pixel display region having a pixel electrode. In the embodiment, the region II as the second region will be described as a test circuit by way of example.

Figure 2B:
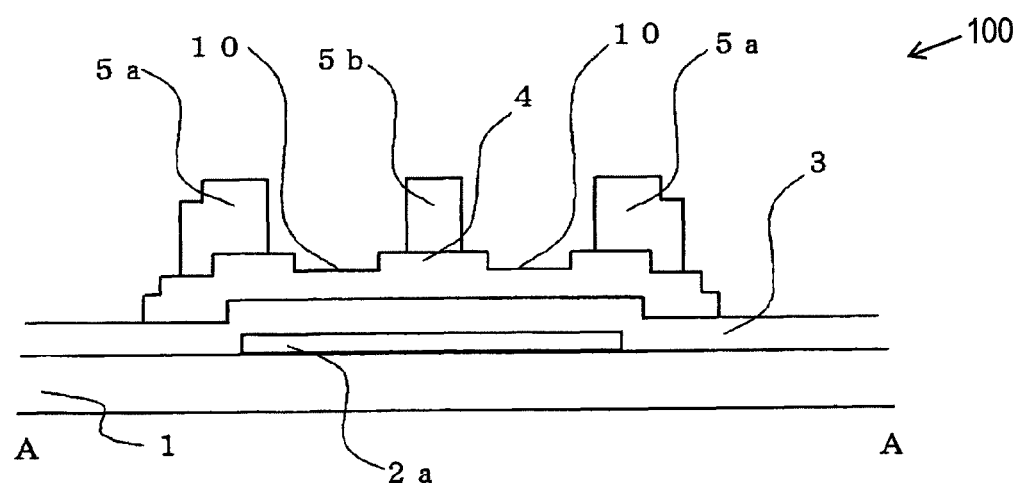
FIG. 2(b) is a cross-sectional view illustrating Embodiment 1 of the invention.

FIG. 2(a) shows a plan view of the test circuit disposed outside the pixel region in the thin film transistor substrate 100 according to the embodiment. FIG. 2(b) shows a cross-sectional view at a part represented by the line A-A in FIG. 2(a). The gate wiring 2 as the second gate wiring is formed on the insulating substrate 1 to connect the gate wiring division pattern 2a and the gate wiring division pattern 2b in parallel to each other, which are formed of, for example, Al, Mo, W, Cr, alloy based on these elements, or a metal film formed by laminating these materials. W denotes each width, and both of them are separately disposed with a space S therebetween. Since one gate wiring is divided, a width of the wiring necessary on area is represented by W and the sum of S and W. However, the value of the width is larger than the width of the first gate wiring as the gate wiring in the pixel display region. Since the width of the gate wiring is electrically twice of W, the width of the gate wiring in the region is larger than the width of the first gate wiring as the gate wiring in the pixel display region. Herein, the term of "gate wiring" is used as wide means including a gate electrode where a general thin film transistor is formed.

The thin film transistors are formed on each divided gate wiring patterns. First, a gate insulating film 3 is formed to cover the gate wiring 2 on the insulating substrate 1, and a semiconductor layer 4 is formed thereon. The semiconductor layer 4 is formed by laminating an intrinsic layer including no impurity and a layer including a conductive impurity such as phosphorus (P). A conductive layer 5 as a source wiring and a drain wiring is formed on the semiconductor layer 4, and constitutes the thin film transistor.

One part of the conductive layer 5 becomes a source wiring 5a, and the other part becomes a drain wiring 5b. The source wiring 5a and the drain wiring 5b are formed at positions opposed to each other with a back channel portion 10 of the thin film transistor therebetween. In an operation as an MOS transistor, one part serves as a source electrode and the other part serves as a drain electrode according to the state of potential.

The thin film transistor substrate 100 according to the embodiment has a structure in which the gate wiring is divided into a plurality of parts connected in parallel, thereby forming the gate wiring so that a ratio of W to S in each gate wiring is 1.7 or less, preferably 1.0 or less.

With such a configuration, a film thickness of resist formed on the gate wiring division pattern 2a and the gate wiring division pattern 2b of the test circuit outside the pixel display region to perform gray tone exposure is substantially equal to a film thickness of resist formed on the first gate wiring in a relative sparse region such as the pixel display region. As a result, a resist film thickness at a gray tone exposure applied part in the back channel portion after a photolithography process can be made substantially equal. To regulate a range of the ratio of W to S and a causal relationship will be described in detail in the following manufacturing method.

Hereinafter, a relationship between gray tone exposure and a patterning condition of the gate wiring in the region I of the thin film transistor substrate 100 according to the embodiment will be described mainly. First, on the insulating substrate 1, a film as the gate wiring 2 is formed of Al, W, Mo, Cr, alloy based on these elements, or a metal film formed by laminating these materials. Then, the gate wiring 2 is patterned through photolithography, etching, and resist removing processes. The gate wiring 2 has a shape of connecting the gate wiring division pattern 2a and the gate wiring division pattern 2b in parallel to each other. However, the area or the width of the patterning is a factor having an influence on the resist film thickness, which will be described later.

Then, the gate insulating film 3, the semiconductor layer 4, and the conductive layer 5 are formed in order. An intrinsic non-single-crystal silicon layer including no impurity is formed and then a silicon layer including a conductive impurity such as phosphorus (P) is formed, thereby forming the semiconductor layer 4. The conductive layer 5 is formed of Cr, Mo, W, Al, alloy based on these elements, or a metal film formed by laminating these materials.

Figure 3:
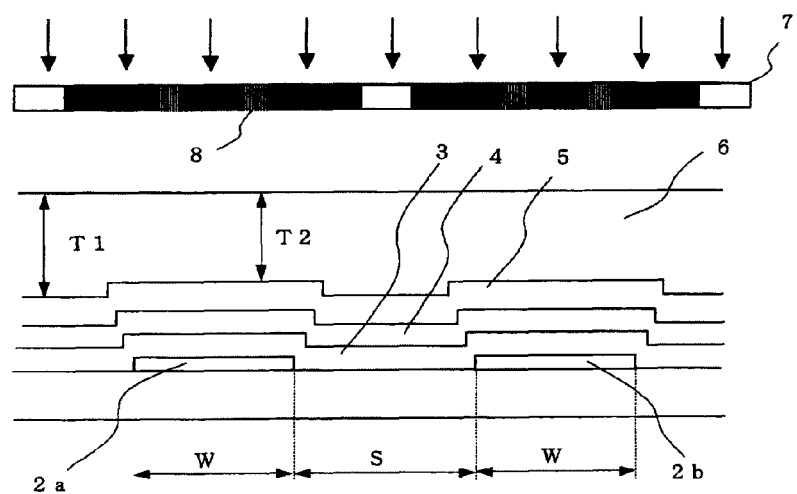
FIG. 3 is a cross-sectional view in a manufacturing process of the invention.

In the photolithography process, a resist 6 is applied by a thickness of 1 to 3 μm. After applying the resist 6, exposure is performed using a mask 7 having a region 8 having a predetermined transmissivity on a part corresponding to the back channel region. FIG. 3 shows a cross-sectional view of the test circuit in this condition. FIG. 3 shows a cross-sectional view of a part represented by the line B-B in FIG. 2(a). In the embodiment, the mask 7 has a structure assuming that a positive type resist is used.

In FIG. 3, the gate wiring 2 is divided into the gate wiring division pattern 2a and the gate wiring division pattern 2b connected in parallel to each other. The gate wiring division patterns 2a and 2b do not necessarily have the same wiring width. They are separately disposed with a space S.

The gate insulating film 3, the semiconductor layer 4, and the conductive layer 5 as the source wiring 5a or the drain wiring 5b are formed to cover the gate wiring division patterns 2a and 2b, and the resist 6 is applied thereon. As the film thickness of the resist 6, there are two thicknesses of T1 in the region where there are not gate wiring division patterns 2a and 2b and T2 on the gate wiring division patterns 2a and 2b. T1 and T2 correspond to T11 and T12 in FIG. 10, respectively.

Figure 4:
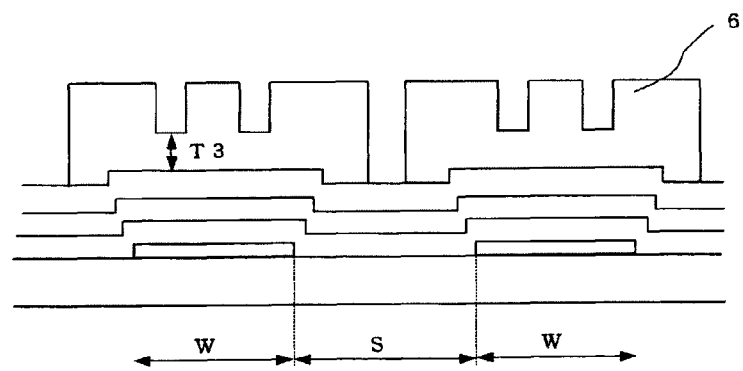
FIG. 4 is a cross-sectional view in a manufacturing process of the invention.

After the condition shown in FIG. 3, a development process is performed. Accordingly, the resist in the region where the semiconductor layer 4 and the conductive layer 5 are to be removed is dissolved. A film thickness of the resist 6 in a region that becomes the back channel portion 10 later, that is, a region corresponding to the region 8 having a predetermined transmissivity becomes small. FIG. 4 shows a cross-sectional view of the condition where the resist film thickness in the desired region is made small by the gray tone exposure as described above.

As shown in FIG. 4, a GT resist film thickness is T3. In consideration of the conditions, a relationship among the width W of the gate wiring division pattern 2a as a foundation, the space S, and the resist film thickness will be described hereinafter.

Figure 5:
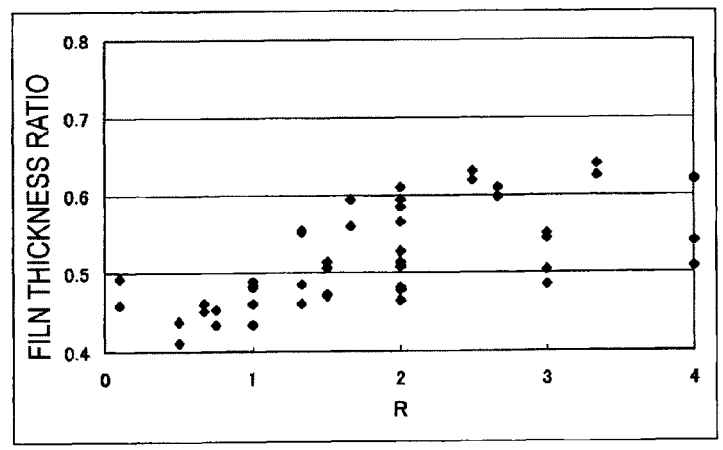
FIG. 5 is a diagram illustrating a relationship between a ratio of a wiring width to a space of a gate wiring and a film thickness ratio according to the embodiment of the invention.

FIG. 5 shows a relationship between a ratio R=W/S of the width W of the divided one gate wiring division pattern to the space S of the adjacent gate wiring division pattern width and the film thickness ratio. Herein, the term of "film thickness ratio" is a ratio of a GT resist film thickness T3 when the applied film thickness T1 is 1. In FIG. 5, it is assumed that transmissivity of the region 8 is set so that the film thickness ratio is 0.5.

Figure 10A:
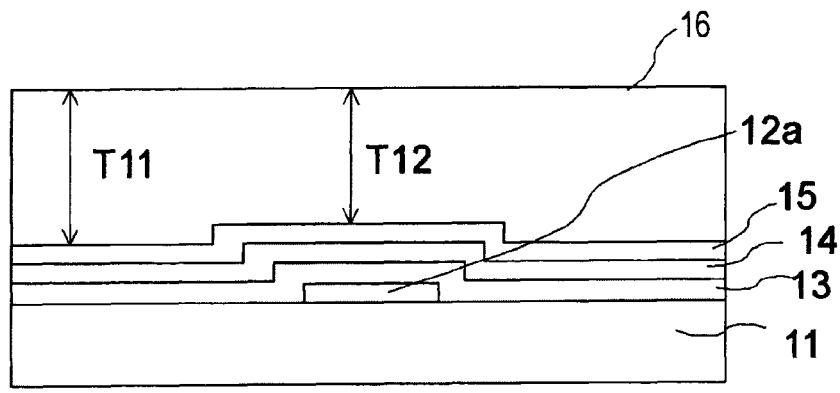
FIGS. 10(a) to 10(c) are views, each of which illustrating a cross-sectional structure in a source wiring forming process in FIG. 9.
Figure 10B:
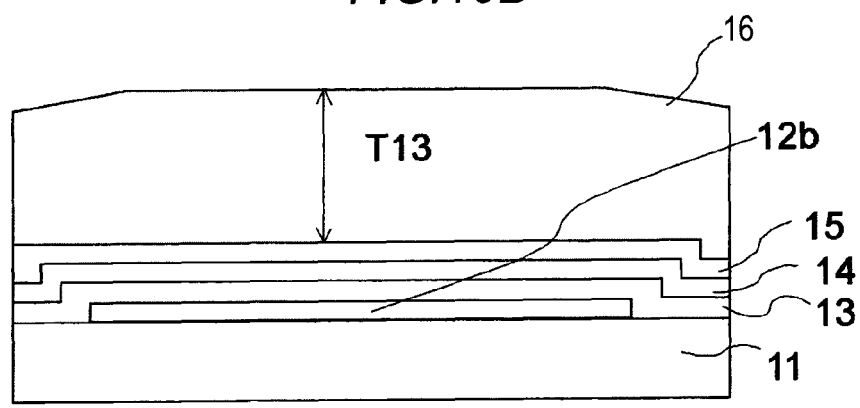
Figure 10C:
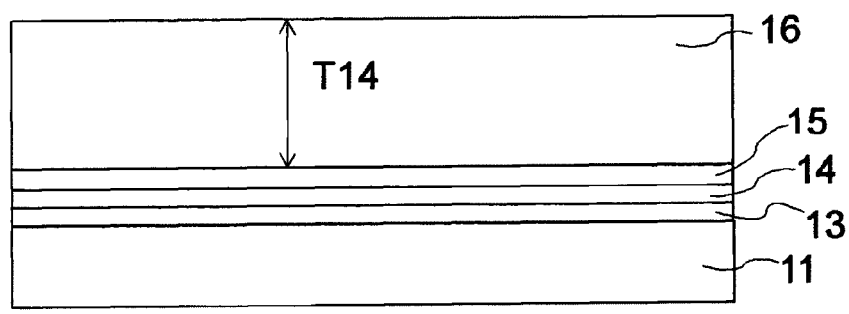

In this case, when the ratio R is increased from the consideration in FIG. 10, the pattern density does not tend to be sparse but dense, and the resist film thickness gets closer to the condition of T13 than that of T12. For this reason, the increase of the ratio R causes an increase of the applied film thickness of the resist in the gate wiring portion, and further causes an increase of the GT resist film thickness T3.

In an experiment, it was confirmed that the film thickness ratio is increased by the increase of the ratio R as can be seen from FIG. 5. In this case, considering a permissible range of non-uniformity as 10% or less, the upper limit of the film thickness ratio becomes 0.6. The ratio R satisfying the upper limit becomes 1.7. When the ratio R is 1.0 or less, the film thickness ratio can be kept in 0.5 like the setting value, which is more preferable.

Figure 6:
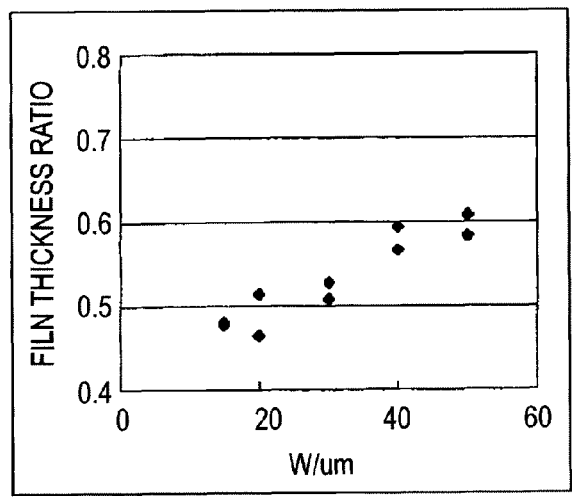
FIG. 6 is a diagram illustrating a relationship between a wiring width of a gate wiring and a film thickness ratio according to the embodiment of the invention.

FIG. 6 shows a relationship between the width W of the gate wiring division pattern and the film thickness ratio when the gate wiring is divided. As described above, the upper limit of the film thickness ratio is 0.6, and thus the upper limit of the wiring width W in the case where the film thickness ratio is the upper limit or less becomes 40 μm.

On the basis of the above results, in the embodiment, the patterning is performed so that the ratio R of W to S is 1.7 or less and the pattern width W is 40 μm or less, in the gate wiring division pattern 2a and the gate wiring division pattern 2b.

Figure 7:
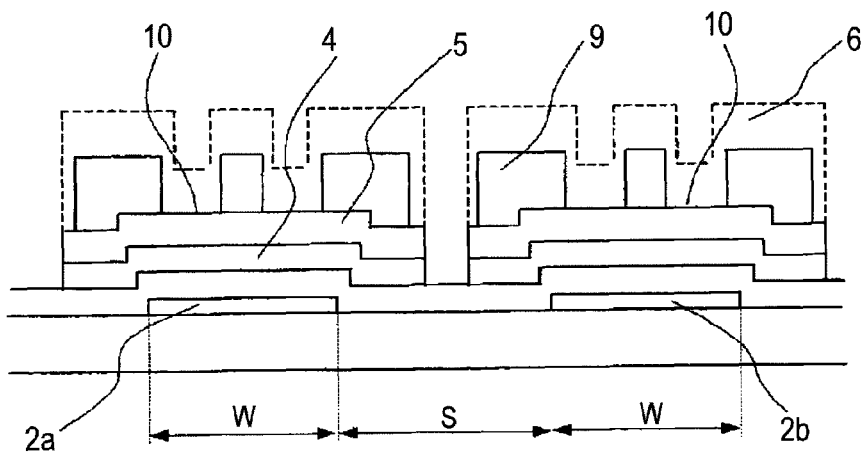
FIG. 7 is a cross-sectional view in a manufacturing process of the invention.

The semiconductor layer 4 and the conductive layer 5 in the region where the resist 6 does not remain are removed from the condition shown in FIG. 4 by etching the conductive layer 5 and the semiconductor layer 4 according to the subsequent etching process (not shown). Then, as shown in FIG. 7, an ashing process is performed as much as the resist on the back channel portion 10 is removed, the resist at this part is removed, and the resist 9 remains in the region remaining as the source wiring 5a and the drain wiring 5b.

Figure 8:
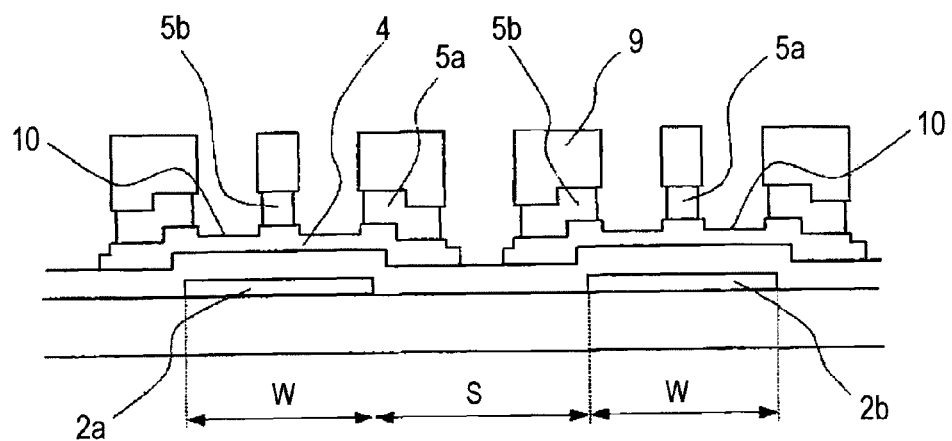
FIG. 8 is a cross-sectional view in a manufacturing process of the invention.
Figure 9:
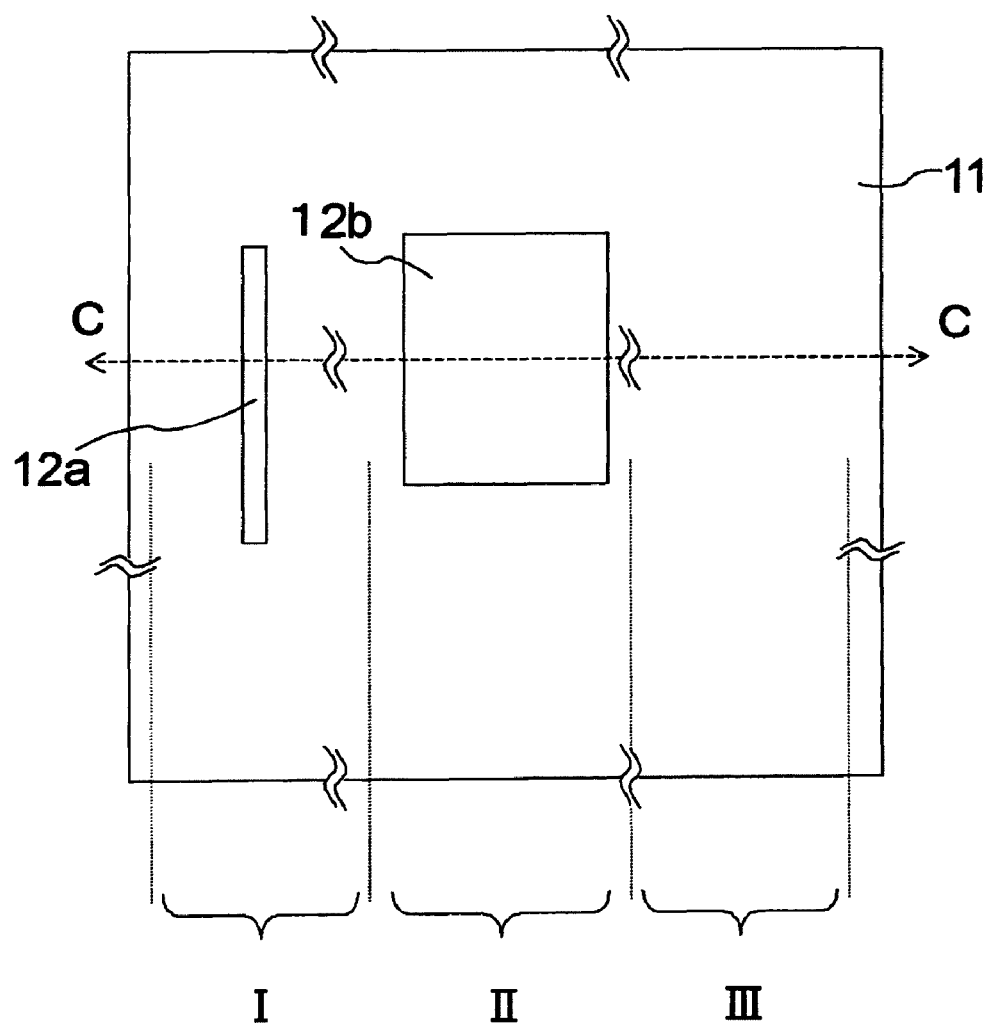
FIG. 9 is a schematic view illustrating a planar disposition of a gate wiring of the known example.

Then, the conductive layer 5 right above the back channel portion 10 is removed by selective etching. Subsequently, the upper layer to which the conductive impurity is added is removed by etching so that the intrinsic layer of the semiconductor layer 4 remains. FIG. 8 shows a cross-sectional view in this condition. In the ashing shown in FIG. 7, since the resist film 6 is reduced to retreat from the pattern edges as well as in a film thickness direction, the semiconductor layer 4 protrudes from the conductive layer 5. Then, the resist 9 is removed, thereby completing the test circuit shown in FIG. 2 and FIG. 3.

Then, an insulating film is formed between the layers by the known method. Contact holes for connecting the pixel electrode and the like to the gate wiring 2, the source wiring 5a, or the drain wiring 5b are formed in the insulating film between the layers or the gate insulating film 3. Subsequently, the pixel electrode or the conductive pattern connected to the conductive layer 5 or the gate wiring 2 are formed through the contact holes as necessary, thereby forming the thin film transistor (TFT) substrate.

As described above, the gate wiring 2 is divided into a plurality of parts so that the resist film thickness T2 on the gate electrode forming the TFT becomes substantially equal to, for example, the region where the main TFT determining performance of a display such as a pixel electrode is formed. As a result, the resist film thickness at the gray tone applied part in the back channel portion after the photolithography can be made substantially equal.

In the embodiment, the gate wiring 2 is divided into two parts by way of example, but the invention may be applied to the case of dividing it into three or more parts, thereby obtaining the same effect.

What is claimed is:

1. A thin film transistor substrate comprising:
    a gate electrode;
    a semiconductor layer that is formed on the gate electrode;
    a source electrode, which is connected to the semiconductor layer and intersects with the gate electrode; and
    an inverted staggered type thin film transistor that is formed at the intersecting part of the gate electrode and the source electrode,
    wherein
        the gate electrode comprises
            a first gate electrode that is provided in a first region and
            a second gate electrode, which is wider than the first gate electrode and that is provided in a second region,
            a back channel portion of the thin film transistor is patterned by gray tone exposure on the first gate electrode and the second gate electrode, and
        the second gate electrode is divided into a plurality of gate electrode wiring divisions that are connected in parallel to form a gate electrode division pattern in the second region.

2. The thin film transistor substrate according to claim 1, wherein
    a ratio of a width of a one of the plurality of gate electrode wiring divisions to a space between each of the plurality of gate electrode wiring divisions is 1.7 or less.

3. The thin film transistor substrate according to claim 2, wherein
    the width of one of the plurality of gate wiring divisions is 40 μm or less.

4. The thin film transistor substrate according to claim 1, wherein
    the first region is a pixel region and
    the second gate electrode in the second region is a gate electrode of a test circuit.

5. The thin film transistor substrate according to claim 1, wherein
    the thin film transistor is formed on the gate electrode division pattern.

6. The thin film transistor substrate according to claim 1, wherein
    the second gate electrode has a substantially rectangular shape including an enclosed void area.

* * * * *